United States Patent
Smith et al.

[11] Patent Number: 5,994,954
[45] Date of Patent: Nov. 30, 1999

[54] METHOD AND APPARATUS FOR PROCESSING AN ANALOGUE SIGNAL

[75] Inventors: David Smith, Penicuik; Ross Nimmo, Twickenham, both of United Kingdom

[73] Assignee: Texas Instruments Incorporated, Dallas, Tex.

[21] Appl. No.: 08/811,332

[22] Filed: Mar. 4, 1997

Related U.S. Application Data

[63] Continuation of application No. 08/523,734, Sep. 5, 1995, abandoned.

[30] Foreign Application Priority Data

Sep. 5, 1994 [GB] United Kingdom .................. 9417832

[51] Int. Cl.⁶ ........................................................ H03F 3/38
[52] U.S. Cl. .......................................... 330/10; 330/251
[58] Field of Search ........................ 330/10, 146, 207 A, 330/251, 297

[56] References Cited

U.S. PATENT DOCUMENTS

| | | | |
|---|---|---|---|
| 4,577,154 | 3/1986 | Takagi et al. | 328/158 |
| 4,673,888 | 6/1987 | Engelmann et al. | 330/10 |
| 5,428,642 | 6/1995 | Ponto | 330/10 X |

FOREIGN PATENT DOCUMENTS

1279508  6/1972  United Kingdom .

Primary Examiner—Steven J. Mottola
Attorney, Agent, or Firm—William B. Kempler; Richard L. Donaldson

[57] ABSTRACT

A method of processing an analogue signal including the steps of converting the analogue signal into a width modulated pulse signal so timed by a clock pulse signal as to provide one width-modulated pulse for each clock pulse and generating, for each clock pulse, a resultant signal having a first level whenever either one of a clock pulse and a width-modulated pulse is present on its own and having a second level for all other relationships between the clock pulse signal and the width-modulated pulse signal.

19 Claims, 6 Drawing Sheets

METHOD AND APPARATUS FOR PROCESSING AN ANALOGUE SIGNAL

This application is a Continuation of application Ser. No. 08/523,734, filed Sep. 5, 1995, now abandoned.

The invention relates to a method and apparatus for processing an analogue signal.

According to the invention a method of processing an analogue signal includes the steps of converting the analogue signal into a width-modulated pulse signal so timed by a clock pulse signal as to provide one width-modulated pulse for each clock pulse and generating, for each clock pulse, a resultant signal having a first level whenever either one of a clock pulse and a width-modulated pulse is present on its own and having a second level for all other relationships between the clock pulse signal and the width modulated pulse signal.

Preferably, an output signal is generated by integrating the resultant signal.

An apparatus for processing an analogue signal includes a comparator circuit for generating a pulse signal which is width-modulated in accordance with the amplitude of the analogue signal at a frequency set by a clock pulse signal, there being one width-modulated pulse for each clock pulse, and an auxiliary circuit capable of generating a resultant signal having a first level whenever either one of a clock pulse and a width-modulated pulse is present on its own and having a second level for all other relationships between the clock pulse signal and the width modulated pulse signal, the auxiliary circuit being connected to receive the clock pulse signal and the width-modulated pulse signal.

Preferably, the auxiliary circuit includes a logic stage capable of performing the exclusive-OR logic function, the logic stage being connected to receive the clock pulse signal and the width-modulated pulsr signal.

Preferably, an averaging circuit for integrating the resultant signal with respect to time is connected to an output port of the auxiliary circuit.

The comparator circuit can include a comparator stage driving an inverter stage or the comparator circuit can include the comparator stage alone. In an arrangement including a comparator stage alone, the clock pulse signal required for the support circuit is the inverted form of the clock pulse signal required for the alternative arrangement having a comparator stage driving an inverter stage.

The analogue signal may be further processed by generating a first output signal by integrating the resultant signal with respect to time and amplitude-modulating the width-modulated pulse signal by means of the first output signal.

Preferably, a second output signal is generated by integrating the amplitude-modulated width-modulated pulse signal with respect to time.

An apparatus for further processing the analogue signal includes an averaging stage connected to an output port of the auxiliary circuit for integrating the resultant signal with respect to time and means connecting an output port of the averaging stage to the comparator circuit for amplitude-modulating the width-modulated pulse signal by means of the integrated resultant signal.

Preferably, the means connecting an output port of the averaging stage to the comparator circuit includes an inverting stage for providing the comparator circuit with a signal of equal and opposite polarity to the integrated resultant signal.

Preferably, a second averaging stage is included for integrating the amplitude-modulated width-modulated pulse signal with respect to time.

Apparatus for processing an analogue signal in accordance with the invention will now be described by way of example only, with reference to the accompanying drawings in which.

Figure 1:
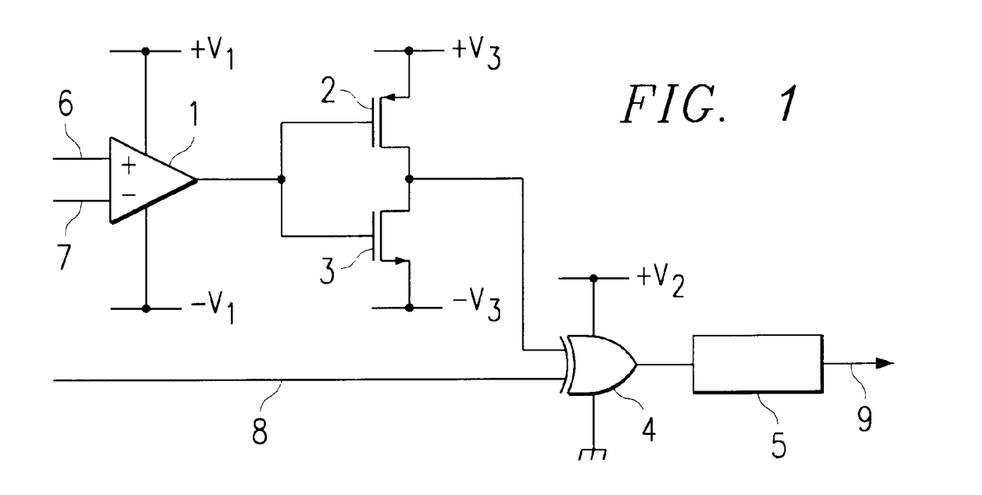
FIG. 1 is a diagrammatic representation of a first form of a full-wave rectifying circuit for rectifying an analogue signal.

Referring to FIG. 1 of the accompanying drawings, the first form of the full-wave rectifying circuit includes a comparator stage having a non-inverting input port 6 and an inverting input port 7, a complementary MOS (CMOS) transistor inverter stage including transistors 2 and 3, an exclusive-OR logic stage 4 including a first input port 8 that serves as an input port for the full-wave rectifying circuit and an averaging stage 5 having an output port 9 serving as an output port for the full-wave rectifying circuit.

The comparator stage 1 has its output port connected to the gate electrodes of the PMOS transistor 2 and the NMOS transistor 3. The drain electrodes of the transistors 2 and 3 are connected together and are connected to a second input port of the exclusive-OR logic stage 4. The exclusive-OR logic stage 4 has an output port connected to the input port of the averaging stage 5. The PMOS transistor 2 and the NMOS transistor 3 are both enhancement mode devices.

In use, the first form of the full-wave rectifying circuit receives an analogue input signal on the non-inverting input port 6 of the comparator stage 1 and a ramp signal on the inverting input port 7 of the comparator stage 1. The comparator stage 1 is energised by an electrical source providing positive ($+V_1$) and negative ($-V_1$) voltages at respective voltage supply ports. The input signal applied to the non-inverting input port 6 of the comparator stage 1 may be as represented by the signal A in FIG. 3 of the accompanying drawings and the ramp signal applied to the inverting input port 7 of the comparator stage 1 may be as represented by the signal B in FIG. 3 of the accompanying drawings. The ramp signal B consists of linear rising portions joined by abrupt falling portions. The signal A is shown as being substantially sinusoidal.

Figure 3:
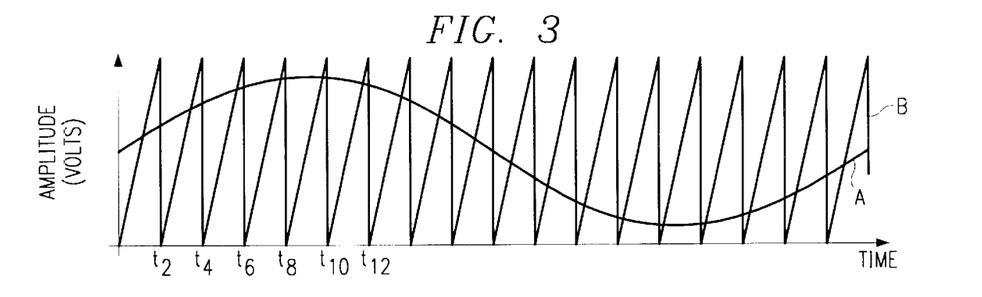
FIG. 3 is a diagrammatic representation of an input signal that the full-wave rectifying circuit of FIG. 1 can handle and a ramp signal required to operate the full-wave rectifying circuit of FIG. 1.
Figure 4:
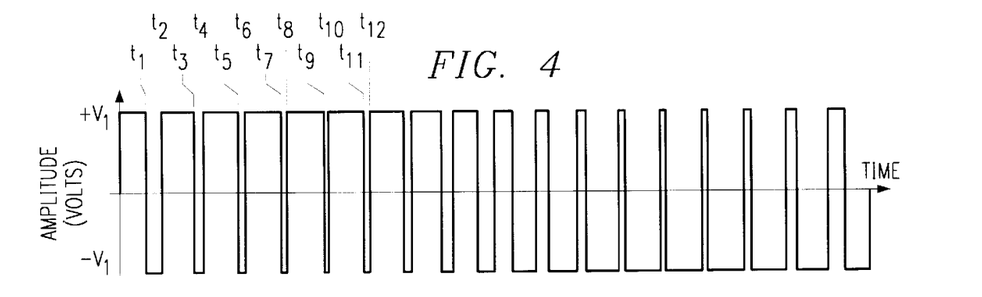
FIG. 4 is a diagrammatic representation of a first width-modulated pulse signal generated within the full-wave rectifying circuit of FIG. 1 when driven by the signals of FIG. 3.

The comparator stage 1 produces an output signal as shown in FIG. 4 of the accompanying drawings when provided with signals as are shown in FIG. 3 of the accompanying drawings. As shown in FIG. 4, the output signal from the comparator stage 1 is substantially equal to $+V_1$ volts, the positive supply voltage, when the amplitude of the signal A exceeds the amplitude of the ramp signal B and the output signal of the comparator stage 1 is substantially equal to $-V_1$ volts, the negative supply voltage, when the amplitude of the signal A is less than the amplitude of the ramp signal B, there being abrupt transitions between the two values of the output signal from the comparator stage 1. The output signal from the comparator stage 1 is a width-modulated pulse signal in which the amplitude of the signal A is represented linearly by the widths of the pulses. The signal A is recoverable from the output signal from the comparator stage 1 by integration of the output signal from the comparator stage 1 with respect to time. As shown in FIG. 4, the abrupt transitions of the output signal from the comparator 1 occur at times $t_1, t_2, t_3 \ldots$, and so on, the positive-going transitions occurring at the times $t_2, t_4 \ldots$ and so on.

Figure 5:
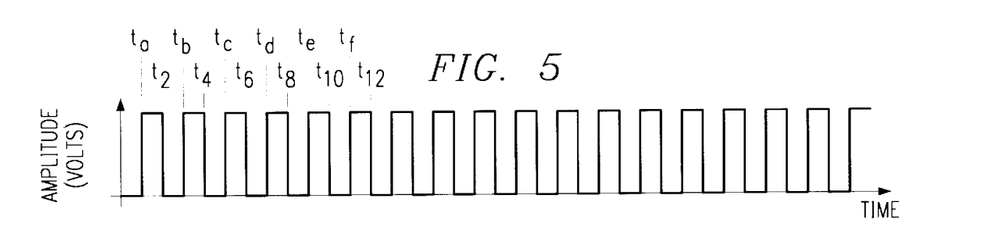
FIG. 5 is a diagrammatic representation of a clock pulse signal, the first clock pulse signal required by the full-wave rectifying circuit of FIG. 1.

The full-wave rectifying circuit shown in FIG. 1 also receives a rectangular clock pulse signal as shown in FIG. 5 of the accompanying drawings, the rectangular clock pulse signal having a 1:1 mark to space ratio and falling edges which coincide with the abrupt falling portions of the ramp signal B. The clock signal is applied to the input port which is the same as the first input port 8 of the exclusive-OR logic stage 4. The second input port of the exclusive-OR logic stage 4 receives an inverted form of the output signal from the comparator stage 1 by way of the transistor inverter stage consisting of the transistors 2 and 3. As shown in FIG. 5, the rectangular clock pulse signal has abrupt transitions at times $t_a, t_2, t_b, t_4, \ldots$, and so on, the negative-going transitions occurring at the times $t_2, t_4, \ldots$ and so on.

The signal from the transistor inverter stage 2, 3 is applied to the exclusive-OR logic stage 4 along with the clock pulse signal 8 and the output signal from the exclusive-OR logic stage 4 is applied to the averaging stage 5 which performs smoothing of the output signal from the full-wave rectifying circuit.

Figure 6:
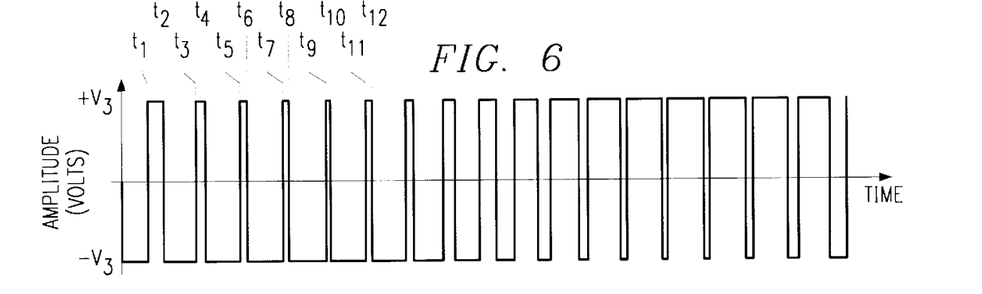
FIG. 6 is a diagrammatic representation of the inverted form of the first width-modulated pulse signal as generated within the full-wave rectifying circuit of FIG. 1.

The signal from the transistor inverter stage 2, 3 is shown in FIG. 6 of the accompanying drawings. As shown in FIG. 6, the signal from the transistor inverter stage 2, 3 is the inverted form of the output signal from the comparator stage 1 shown in FIG. 4 and has limits of $+V_3$ volts and $-V_3$ volts set by the supply voltage for the transistors 2, 3. As shown in FIG. 6, the abrupt transitions of the inverted signal provided by the transistor inverter stage 2, 3 still occur at times $t_1, t_2, t_3 \ldots$, and so on, but are reversed in relation to the transitions for FIG. 4.

Figure 7:
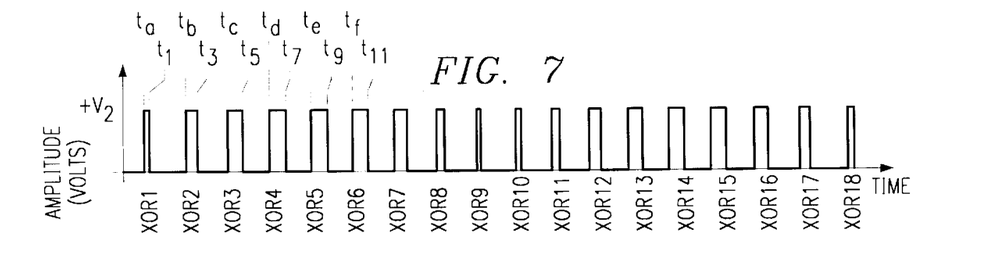
FIG. 7 is a diagrammatic representation of a second width-modulated pulse signal generated as an output signal by the full-wave rectifying circuit of FIG. 1.

FIG. 7 of the accompanying drawings shows the output signal from the exclusive-OR logic stage 4 when provided with the signals shown in FIGS. 5 and 6 of the accompanying drawings. Estimating values of 1.0, 1.5, 2.0, 2.0, 2.5, 2.5, 1.5, 1.0 and 0.5 units of (amplitude×time) for the accumulated values of the signals XOR1 to XOR9 for the first nine clock cycles of the clock signal shown in FIG. 7, the total accumulated value of those nine signals is 14.5 units of (amplitude×time) taking the width of the rectangular clock signal to be 1 unit of time and its amplitude to be 4 units of amplitude. Estimating values of 1.0, 1.5, 2.0, 2.0, 2.5, 2.5, 1.0, 1.5 and 0.5 units of (amplitude×time) for the integrated values of the signals XOR10 to XOR18 for the next nine clock cycles, the total integrated value of those five signals is 14.5 units of (amplitude ×time).

The exclusive-OR logic stage 4 produces an output pulse whenever either one of a clock pulse signal and a width-modulated pulse is present on its own and produces no output pulse for all other relationships between the clock pulse signal and the width-modulated pulse signal. The result of the exclusive-OR operation is that the pulse XOR1 extends from $t_a$ to $t_1$, the pulse XOR2 extends from $t_b$ to $t_3$, the pulse XOR3 extends from $t_c$ to $t_5$, when the clock pulse signal has abrupt transitions at $t_a, t_2, t_b, t_4, t_c, t_6$, and so on, while the width-modulated pulse signal has abrupt transitions at $t_1, t_2, t_4$, and so on.

FIG. 7 shows that the pulse XOR1 extends from a time $t_a$ to a time $t_1$, the pulse XOR2 extends from a time $t_b$ to a time $t_3$, the pulse XOR3 extends from a time tc to a time $t_5$, and so on, where $t_a, t_b$ and $t_c$ are the times at which the clock signal makes its positive transitions and $t_1, t_3$, and $t_5$ are the times at which the inverted width-modulated pulse signal of FIG. 6 makes its positive transitions. The output from the exclusive-OR logic stage 4 of FIG. 1 is unidirectional, as shown in FIG. 7, and provides, in effect, rectified values dependent on the amplitude of the signal A at the times of its intersection with the ramp signal B, the d.c. component of the signal A having been cancelled in the comparator stage 1 by ensuring that the d.c. level of the ramp signal 8 is equal to the d.c. level of the signal A. As is evident from the symmetry of the signal A and the ramp signal B about their common d.c. level, the rectified values XOR1 to XOR9 are substantially the same as the rectified values XOR10 to XOR18 and the accumulated total of the values of the pulses XOR1 to XOR9 is substantially equal to the accumulated total of the values of the pulses XOR10 to XOR18, that expectation being consistent with the estimated totals of the values of those pulses as calculated above. The pulses XOR1 to XOR9 relate to a positive half-cycle of the sinusoidal signal A while the pulses XOR10 to XOR18 relate to a negative half-cycle of the sinusoidal signal A and the accumulated total of the values XOR1 to XOR18 represents a full-wave rectified value of the sinusoidal signal A. The averaging stage 5 provides a smoothed average value from the pulses XOR1 to XOR18 as an overall output from the full-wave rectifying circuit of FIG. 1.

Figure 2:
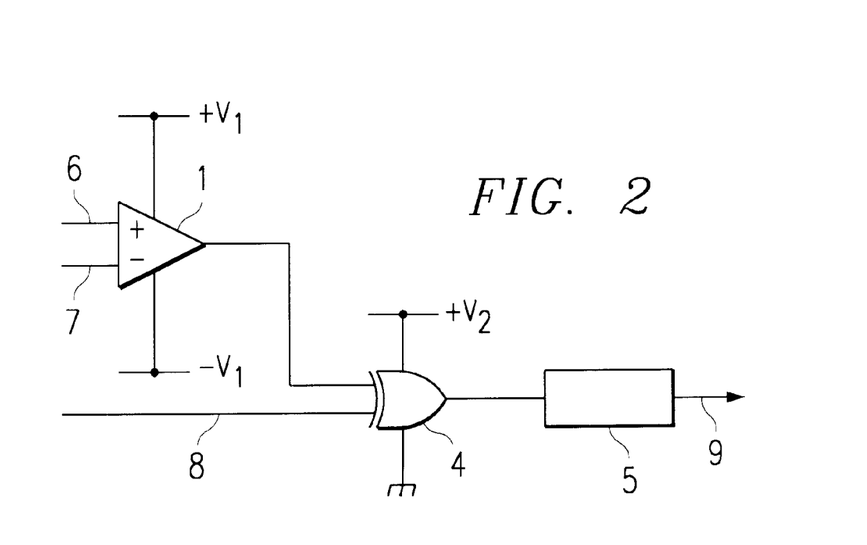
FIG. 2 is a diagrammatic representation of a second form of a full-wave rectifying circuit for rectifying an analogue signal.

Referring to FIG. 2 of the accompanying drawings, the second form of full-wave rectifying circuit includes a comparator stage 1, an exclusive-OR logic stage 4 and an averaging stage 5. The second form of full-wave rectifying circuit includes input ports 6,7 and 8 and an output port 9. The comparator stage 1 has an output port connected to a first input port of the exclusive-OR logic stage 4 and the input port 8 serves as a second input port of the exclusive-OR logic stage 4. The non-inverting and inverting input ports of the comparator stage 1 serve as the input ports 6 and 7 of the full-wave rectifying circuit. The exclusive-OR logic stage 4 has an output port connected to the input port of the averaging stage 5.

Figure 8:
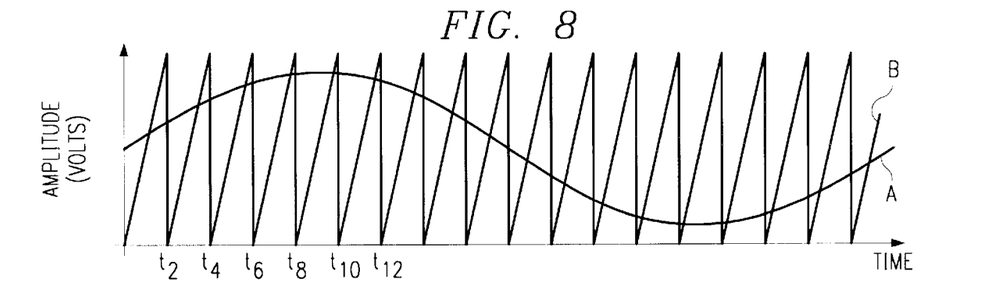
FIG. 8 is a diagrammatic representation of the input and ramp signals of FIG. 3 applied to the second form of full-wave rectifying circuit as represented by FIG. 2.

The second form of full-wave rectifying circuit shown in FIG. 2 is capable of operating with the signals shown in FIG. 8 as input signals, those signals being a substantially sinusoidal signal A and a ramp signal B, the signals A and B represented in FIG. 8 being the same as the signals A and B represented in FIG. 3.

Figure 9:
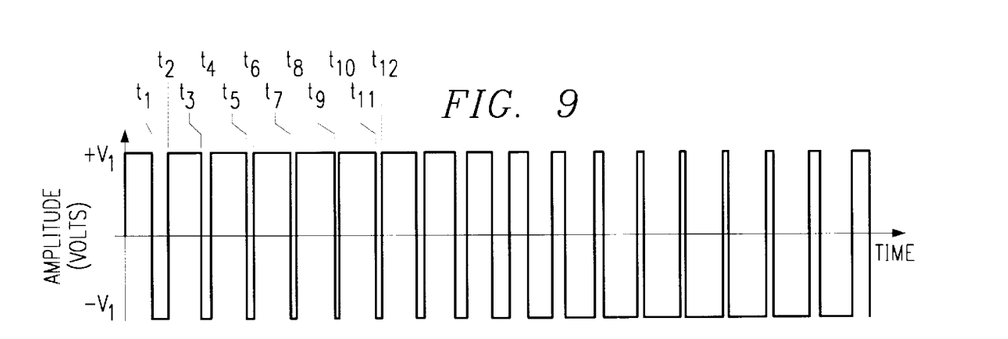
FIG. 9 is a diagrammatic representation of a width-modulated pulse signal generated within the second form of full-wave rectifying circuit.

FIG. 9 shows that the comparator stage 1 provides a width-modulated pulse signal that has abrupt transitions at times $t_1$, $t_2$, $t_3$, and so on, which are the times when the input signal A and the ramp signal B have the same amplitude. The width-modulated pulse signal shown in FIG. 9 is positive while the amplitude of the input signal A exceeds that of the ramp signal B and negative when the situation is reversed. The maximum and minimum limits of the width-modulated pulse signal of FIG. 9 are +V volts and −V volts, the upper and lower supply voltages to the comparator stage 1.

Figure 10:
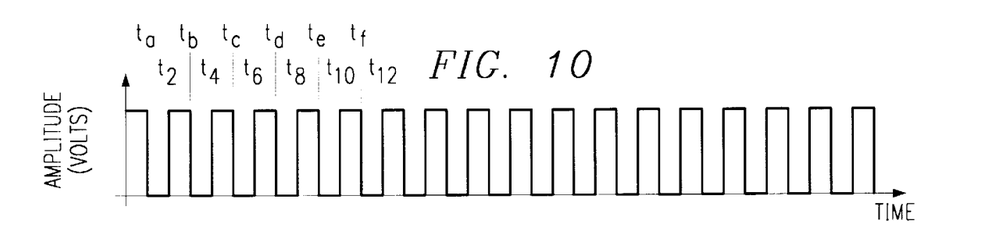
FIG. 10 is a diagrammatic representation of a clock pulse signal, the second clock pulse signal, required by the second form of full-wave rectifying circuit, the second clock pulse signal being the inverted form of the first clock pulse signal of FIG. 5.

FIG. 10 shows a clock pulse signal required for the operation of the full-wave rectifying circuit of FIG. 2, the clock signal being positive initially with negative-going transitions at times $t_a$, $t_b$, $t_c$, and so on, and positive-going transitions at times $t_2$, $t_4$, $t_6$, and so on, where the times $t_2$, $t_4$, $t_6$, and so on, coincide with the abrupt transitions at the times $t_2$, $t_4$, $t_6$, and so on, for the ramp signal B of FIG. 8. The clock pulse signal is a rectangular signal having a 1:1 mark to space ratio.

The width-modulated pulse signal shown in FIG. 9 is the same as the signal shown in FIG. 4 while the clock pulse signal shown in FIG. 10 is the inverted form of the clock pulse signal shown in FIG. 5.

Figure 11:
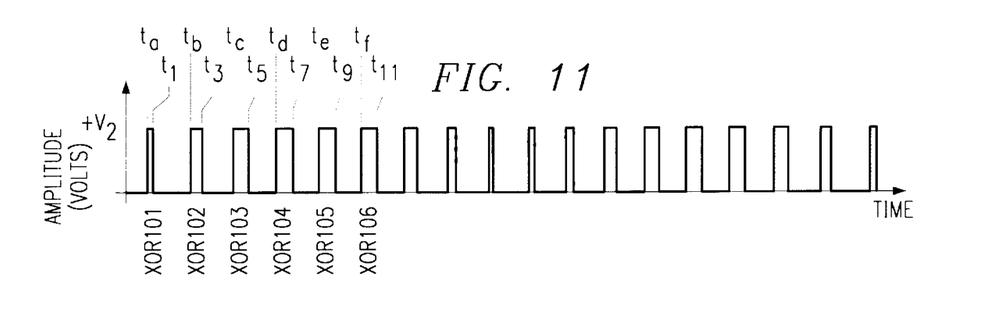
FIG. 11 is a diagrammatic representation of a width-modulated pulse signal generated as an output signal by he second form of the full-wave rectifying circuit.

The exclusive-OR logic stage 4 is driven by the width-modulated pulse signal of FIG. 9 and the clock pulse signal of FIG. 10. As shown in FIG. 11, the exclusive-OR logic stage 4 provides a plurality of positive pulses XOR101, XOR102, XOR103, and so on. The pulse XOR101 extends from a time $t_a$ to a time $t_1$, the pulse XOR102 extends from a time $t_b$ to a time $t_3$, the pulse XOR103 extends from a time $t_c$ to a time $t_5$, and so on, from which it can be seen that the pulses XOR101, XOR102, XOR103, and so on, are the same as the pulses XOR1, XOR2, XOR3, and so on, of FIG. 7, establishing that the circuits of FIGS. 1 and 2 provide the same result. The other relationships established above in respect of FIG. 1 apply to FIG. 2 also.

The pulse output signal from the exclusive-OR logic stage 4 of FIG. 1 or FIG. 2 may be used as an output signal or may be applied to an averaging stage such as the stage 5 of FIG. 1 or FIG. 2 and that signal used as an output signal.

Figure 12:
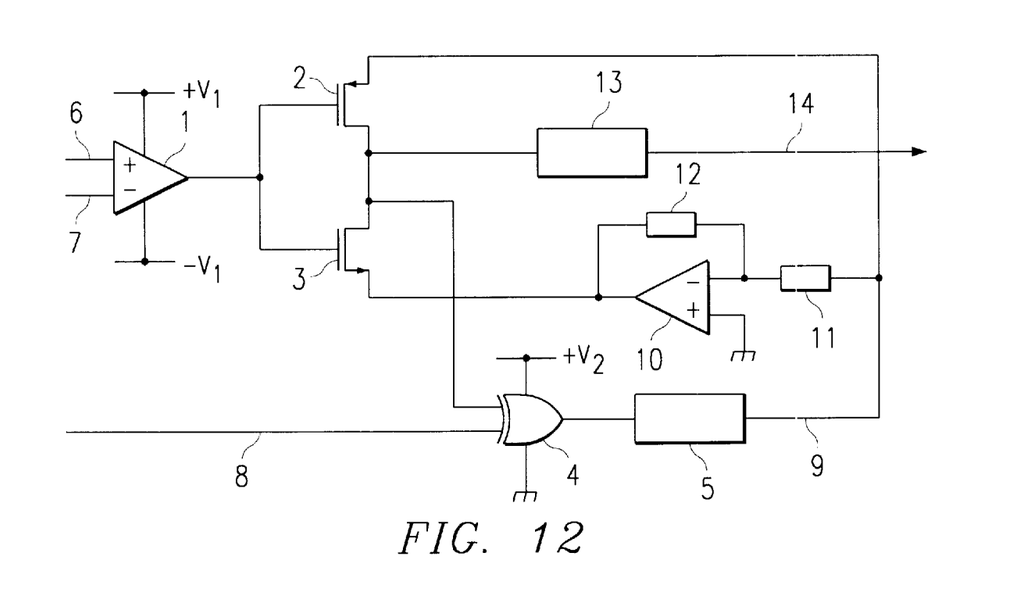
FIG. 12 is a diagrammatic representation of a first form of controlled-gain circuit for amplifying an analogue signal.
Figure 13:
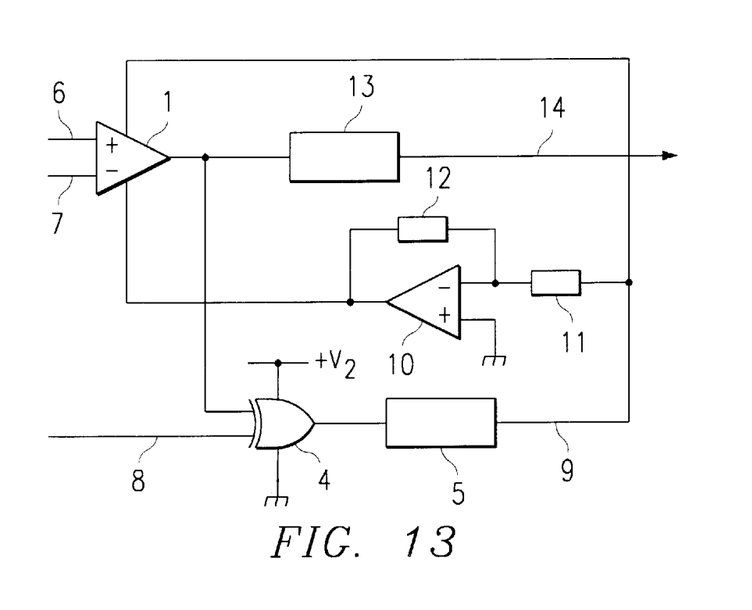
FIG. 13 is a diagrammatic representation of a second form of controlled-gain circuit for amplifying an analogue signal.

The full-wave rectifying circuit of either FIG. 1 or FIG. 2, using the output signal from the averaging stage 5, may be applied to a gain-controlled circuit as shown in either FIG. 12 or FIG. 13 of the accompanying drawings.

Referring to FIG. 12 of the accompanying drawings, the controlled-gain circuit includes a comparator stage 1, a complementary MOS (CMOS) transistor inverter stage including transistors 2 and 3, an exclusive-OR logic stage 4, an averaging stage 5, an inverting source follower stage including an amplifier 10 with resistors 11 and 12, an output filter stage 13 and an output port 14 connected to the output filter stage 13. The comparator stage 1, the CMOS transistor inverter stage including the transistors 2 and 3, the exclusive-OR logic stage 4 and the averaging stage 5 of FIG. 12 are the same as those components of FIG. 1 with the same reference numerals.

The comparator stage 1 includes non-inverting and inverting input ports 6 and 7. The comparator stage 1 has an output port which is connected to to the gate electrodes of the transistors 2 and 3, the transistor 2 being a PMOS enhancement mode device and the transistor 3 being an NMOS enhancement mode device. The drain electrodes of the transistors 2 and 3 are connected together and are connected to a second input port of the exclusive-OR logic stage 4. The exclusive-OR logic stage 4 has a first input port which serves as an input port 8 of the controlled-gain circuit. An output port of the exclusive-OR logic stage 4 is connected to an input port of the averaging stage 5 an output port of which is connected to the source electrode of the PMOS transistor 2. The output port of the averaging stage 5 is connected, also, to an input port of the inverting source follower stage which has an output port connected to the source electrode of the NMOS transistor 3. An input port of the output filter stage 13 is connected to the drain electrodes of the transistors 2 and 3 while an output port 14 of the output filter stage 13 provides an output port of the controlled-gain circuit.

In use, the controlled-gain circuit receives an input signal on the non-inverting port 6 of the comparator stage 1 and a ramp signal on the inverting input port 7 of the comparator stage 1. The comparator stage 1 is energised by an electrical source providing positive (+V) and negative (−V) voltages at respective voltage supply ports.

Figure 14:
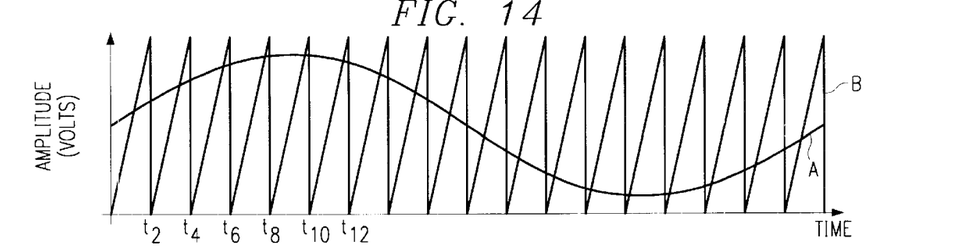
FIG. 14 is a diagrammatic representation of input and ramp signals for the controlled-gain circuit of FIG. 12.

The input signal applied to the non-inverting input port 6 of the comparator stage 1 may be as represented by the signal A and the ramp signal applied to the inverting input port 7 of the comparator stage 1 may be as represented by the signal B, shown in FIG. 14 of the accompanying drawings. The ramp signal B consists of linear rising portions joined by abrupt falling portions. The signal A is shown as being sinusoidal.

Figure 15:
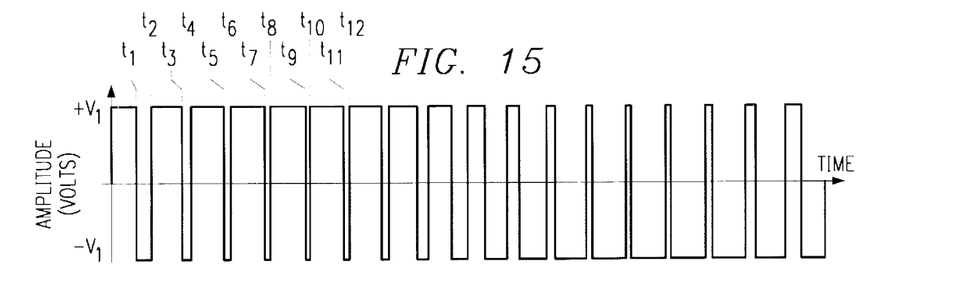
FIG. 15 is a diagrammatic representation of a width-modulated signal generated within the controlled gain circuit of FIG. 12, when driven by the signals shown in FIG. 14.

The comparator stage 1 produces an output signal as shown in FIG. 15 of the accompanying drawings when the signals A and B are applied to its input ports. As shown in FIGS. 14 and 15, the output signal from the comparator stage 1 is equal to the positive supply voltage $+V_1$ volts when the amplitude of the signal A exceeds the amplitude of the ramp signal B and the output signal from the comparator 1 is equal to the negative supply voltage $−V_1$ volts when the amplitude of the signal A is less than the amplitude of the ramp signal B. The transitions between the extremes of the output signal from the comparator stage 1 are abrupt and the output signal is a width-modulated pulse signal in which the widths of the pulses correspond linearly to the amplitudes of the signal A at its intersections with the ramp signal B. The signal A is recoverable from the width-modulated pulse signal by integration of the width-modulated pulse signal with respect to time.

Figure 17:
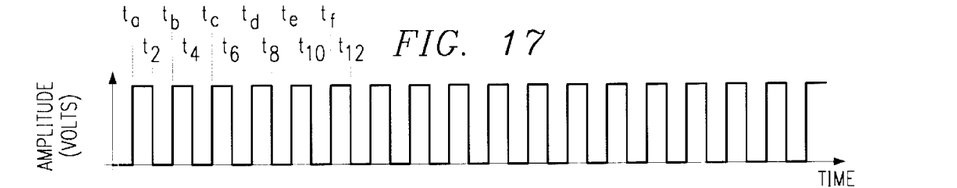
FIG. 17 is a diagrammatic representation of a clock pulse signal required by the controlled-gain circuit shown in FIG. 12.

The controlled-gain circuit shown in FIG. 12 also receives a rectangular clock pulse signal as shown in FIG. 17 of the accompanying drawings, the rectangular clock pulse signal having a 1:1 mark to space ratio and falling edges that coincide with the abrupt falling portions of the ramp signal B of FIG. 14. The clock pulse signal is applied to the second input port of the exclusive-OR. logic stage 4, by way of the input port 8 of the controlled-gain circuit, and the second input port of the exclusive-OR logic stage 4 receives an inverted form of the output signal from the comparator stage 1 as provided by the transistor inverter stage defined by the transistors 2 and 3.

So far, the operation of the controlled-gain circuit of FIG. 12 is the same as that of the circuit of FIG. 1.

The signal from the transistor inverter stage defined by the transistors 2 and 3 is applied to the exclusive-OR stage 4 along with the clock pulse signal, the output signal from the exclusive-OR logic stage 4 is applied to the averaging stage 5 and the output signal from the averaging stage 5 is applied to the source electrode of the PMOS transistor 2. The output signal from the averaging stage 5 is a positive voltage that is the average of the signal shown in FIG. 18 of the accompanying drawings. A negative voltage equal in size to the output signal from the averaging stage 5 is generated by the inverting source follower stage 10, 11, 12 and the negative voltage is applied to the source electrode of the NMOS transistor 3.

Figure 18:
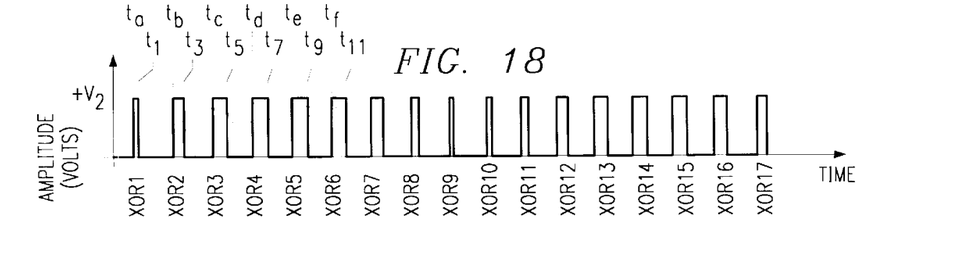
FIG. 18 is a diagrammatic representation of a width-modulated pulse signal generated within the controlled-gain circuit shown in FIG. 12.

It is evident from a comparison of FIG. 18 with FIG. 7 that the output of the exclusive-OR logic stage 4 is the same for the controlled-gain circuit of FIG. 12 as it is for the rectifying circuit of FIG. 1.

Figure 16:
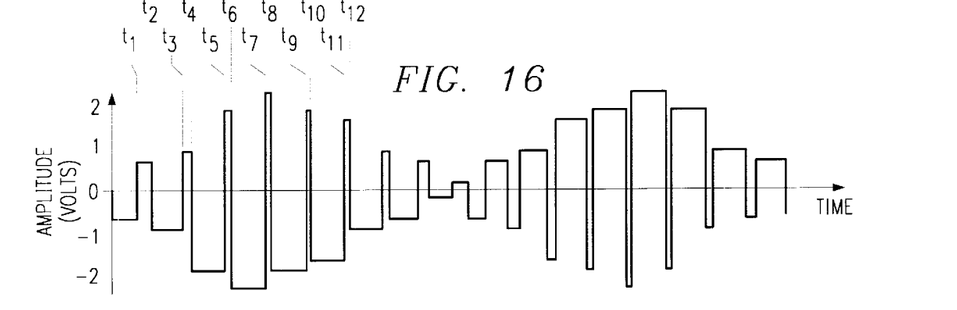
FIG. 16 is a diagrammatic representation of an amplitude-modulated width-modulated pulse signal generated as an output signal by the controlled-gain circuit of FIG. 12 when driven by the signals shown in FIG. 14.

FIG. 16 of the accompanying drawings shows the output signal from the transistor inverter stage defined by the transistors 2 and 3. The source electrode of the PMOS transistor 2 is supplied with the varying voltage provided by the averaging stage 5 and its output signal, being the positive excursions of the signal shown in FIG. 16, varies in amplitude with that supply voltage. The source electrode of the NMOS transistor 3 is supplied with a mirror image of the varying voltage from the averaging stage F. and its output signal is represented by the negative excursions of the signal shown in FIG. 16. Comparison of the positive and negative transitions of the signals shown in FIGS. 15 and 16 establishes that the signal shown in FIG. 16 is the inverted form of the signal shown in FIG. 15, the signal shown in FIG. 15 being the output signal from the comparator stage 1.

The estimated integrated values of the signals XOR1 to XOR17 of FIG. 18 from the exclusive-OR logic stage 4 of FIG. 12 are the same as given above for FIG. 7 and the output signal from the averaging circuit 5 is a full-wave rectified value for the input signal A with a scaling factor applied according to the effective gain of the full-wave rectifying part of the circuit of FIG. 12.

In practice, the output signal from the averaging stage 5 adjusts gradually from clock pulse to clock pulse and the amplitude variations of the output signal from the transistors 2 and 3 are less rapid than shown in FIG. 16.

The output filter stage 13 provides a filtered form of the signal shown in FIG. 16 on the output port 14.

The signal provided on the output port 14 has the form of the input signal A amplified in accordance with the amplitude of the signal A itself.

FIG. 13 represents a simplified arrangement of the controlled-gain circuit of FIG. 12, the inverting stage formed by the two transistors 2 and 3 being omitted.

Referring to FIG. 13, the output port of the averaging stage 5 is connected to the positive voltage supply terminal of the comparator stage 1 and the output port of the inverting source follower stage 10, 11, 12 is connected to the negative voltage supply terminal of the comparator stage 1. The output port of the comparator stage 1 is connected to a second input port of the exclusive-OR stage 4 and, also to the input port of the output filter stage 13.

The simplified controlled-gain circuit shown in FIG. 13 can be regarded as a combination of the full-wave rectifying circuit of FIG. 2 with the source follower stage 10, 11, 12 and the output filter stage 13.

Figure 19:
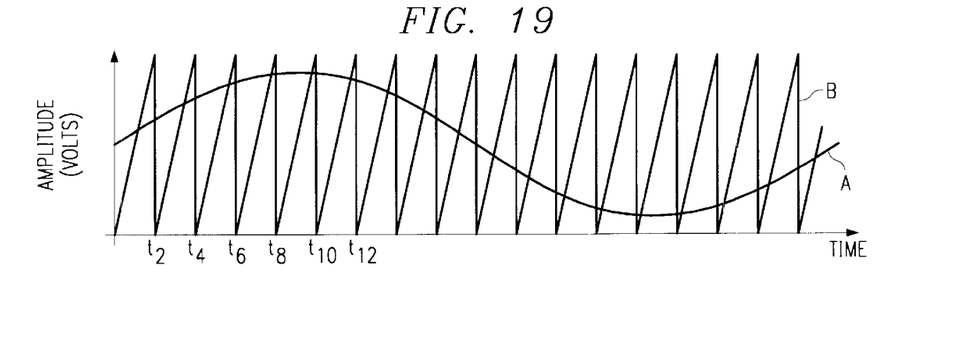
FIG. 19 is a diagrammatic representation of the input and ramp signals of FIG. 14 applied to the second form of controlled-gain circuit shown in FIG. 13.
Figure 21:
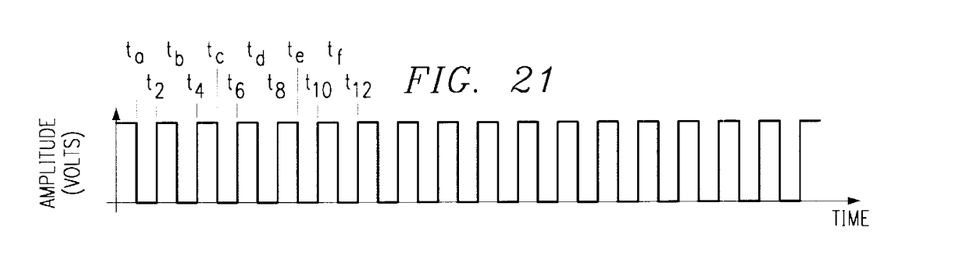
FIG. 21 is a diagrammatic representation of a clock pulse signal required by the second form of controlled-gain circuit and FIG. 22 is a diagrammatic representation of a width-modulated pulse signal generated within the second form of gain-controlled circuit.

The operation of the controlled-gain circuit shown in FIG. 13 is understood by considering it as receiving an input signal A and a ramp signal B as shown in FIG. 19, the signals A and B being the same as shown in FIGS. 3, 8 and 14. The circuit of FIG. 13 requires a clock pulse signal as shown in FIG. 21, that clock pulse signal being the same as the clock pulse signal shown in FIG. 10.

Figure 20:
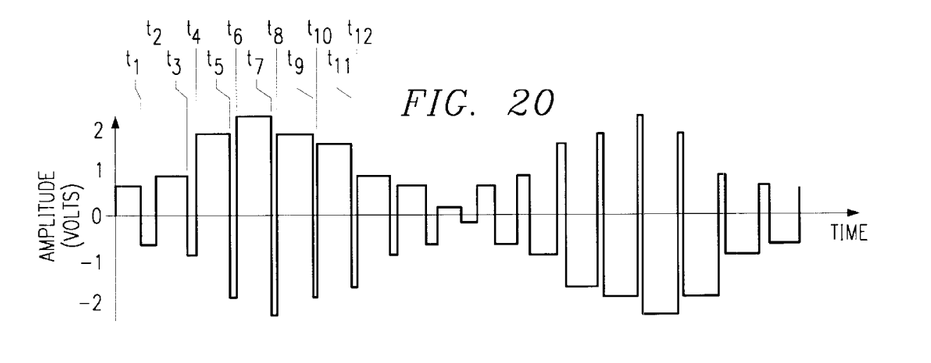
FIG. 20 is a diagrammatic representation of an amplitude-modulated width-modulated signal generated as an output signal by the second form of controlled-gain circuit.

FIG. 20 shows the output signal from the comparator stage 1 which generates a width-modulated pulse signal with abrupt transitions at the times $t_1$, $t_2$, $t_3$, $t_4$, and so on, at which the signals A and B intersect each other, the width-modulated pulse signal being positive when when the input signal A exceeds the ramp signal B in amplitude and negative when the position is reversed. The extent to which the width-modulated pulse signal is positive or negative is determined by the supply voltages to the comparator stage 1 and those supply voltages are determined by the output signal from the averaging stage 5. The output signal from the averaging stage 5 is applied to the positive supply voltage terminal of the comparator stage 1 while an equal negative voltage, generated by the source follower stage 10, 11 and 12, is applied to the negative supply voltage terminal of the comparator stage 1. The overall result is that the comparator stage 1 generates a width-modulated amplitude-modulated signal as shown in FIG. 20 of the accompanying drawings.

Figure 22:
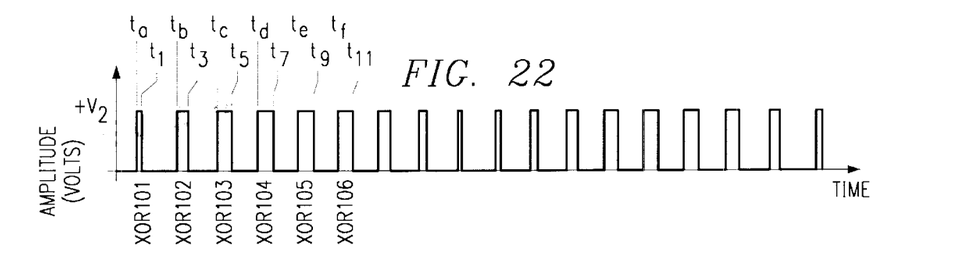

The exclusive-OR logic stage 4 generates a unidirectional pulse signal as shown in FIG. 22, that signal being the same as the signal shown in FIGS. 7, 11 and 18.

The signal shown in FIG. 20 is the inverse of the signal shown in FIG. 16. The output filter stage 13 of FIG. 13 provides an output signal at its port 14 that is the same as is provided by the output filter stage 13 of FIG. 12.

A further alternative arrangement of the controlled-gain circuit of FIG. 12 is obtained by connecting the second input port of the exclusive-OR logic stage 4 to the common gate electrodes of the transistors 2 and 3 instead of to the common drain electrodes of those transistors. The further alternative arrangement of the circuit requires the use of the clock pulse signal shown in FIG. 21 and the output signal from the transistors 2 and 3 is as shown in FIG. 16.

The controlled-gain circuits of FIGS. 12 and 13 are non-linear circuits especially suitable for fabrication using insulated-gate transistors usually referred to as MOS field effect transistors (MOSFETS). Bipolar devices could, nevertheless, be used to fabricate the circuits.

The amplitude-modulated width-modulated signals shown in FIGS. 16 and 20 are generated from the input signal A with a controlled amount of non-linearity and an analogue signal is recoverable by filtering each amplitude-modulated width-modulated signal. The amount of non-linearity present in the amplitude-modulated width-modulated signals or filtered signals derived from them depends on the gain of the full-wave rectifying part of the controlled-gain circuit used in generating the signals.

We claim:

1. A method of processing an analogue signal comprising:

converting the analogue signal into a width-modulated pulse signal so timed by a clock pulse signal as to provide one width-modulated pulse signal for each clock pulse signal;

generating, for each clock pulse signal, a resultant signal having a first level whenever either one of a clock pulse signal and a width-modulated pulse signal is present on its own and having a second level for all other relationships between the clock pulse signal and the width-modulated pulse signal; and generating an output signal by integrating the resultant signal with respect to time.

2. An apparatus for processing an analogue signal comprising:

a comparator circuit for generating a pulse signal which is width-modulated in accordance with the amplitude of the analogue signal at a frequency set by a clock pulse signal, there being one width-modulated pulse signal for each clock pulse signal;

an auxiliary circuit capable of generating a resultant signal having a first: level whenever either one of a clock pulse signal and a width-modulated pulse signal is present on its own and having a second level for all other relationships between the clock pulse signal and the width-modulated pulse signal, the auxiliary circuit being connected to receive the clock pulse signal and the width-modulated pulse signal; and an averaging stage connected to an output port of the auxiliary circuit for integrating the resultant signal with respect to time.

3. An apparatus for processing an analogue signal as set forth in claim 2, wherein the auxiliary circuit includes a logic stage capable of performing the exclusive-OR logic function, the logic stage being connected to receive the clock pulse signal and the width-modulated pulse signal.

4. An apparatus for processing an analogue signal as set forth in claim 2, wherein the comparator circuit includes a comparator stage alone.

5. An apparatus for processing an analogue signal as set forth in claim 2, wherein the comparator circuit includes a comparator stage connected to an inverter stage.

6. A method of processing an analogue signal as set forth in claim 1, further including amplitude-modulating the width-modulated pulse signal by the output signal.

7. A method of processing an analogue signal as set forth in claim 6, further including generating a second output signal by integrating the amplitude-modulated width-modulated pulse signal with respect to time.

8. An apparatus for processing an analogue signal as set forth in claim 2, further including means connecting an output port of said averaging stage to said comparator circuit for amplitude-modulating the width-modulated pulse signal by means of the integrated resultant signal.

9. An apparatus for processing an analogue signal as set forth in claim 8, wherein the means connecting an output port of said averaging stage to said comparator circuit includes an inverting stage for providing, to the comparator circuit, a signal of equal and opposite polarity to the integrated resultant signal.

10. An apparatus for processing an analogue signal as set forth in claim 8, further including a second averaging stage for integrating the amplitude-modulated width-modulated pulse signal with respect to time.

11. An apparatus for processing an analogue signal comprising:

a comparator circuit having first and second inputs and an output for receiving an analogue input signal at the first input and a repetitive ramp signal defined as a rapidly rising forwardly disposed sloping linear portion followed by an abrupt falling vertical linear portion at the second input thereof and generating an output signal, as a result of the comparison of the analogue input signal and the repetitive ramp signal, as a width-modulated pulse signal in accordance with the amplitude of the analogue signal at a frequency set by a clock pulse signal, there being one width-modulated pulse signal for each clock pulse signal;

an auxiliary circuit including a logic stage capable of performing an exclusive-OR logic function, the logic stage having first and second inputs, the first input of said logic stage being connected to receive the clock pulse signal and the second input of said logic stage being connected to the output of said comparator circuit for receiving the width-modulated pulse signal therefrom;

said comparator circuit further including first and second voltage supply ports for respectively receiving positive and negative voltages;

an amplifier having first and second inputs and an output, the first input of said amplifier being connected to the first voltage supply port of said comparator circuit, the second input of said amplifier being connected to ground, and the output of said amplifier being connected to the second voltage supply port of said comparator circuit; and said logic stage of said auxiliary circuit having an output port connected to the first input of said amplifier and to the first voltage supply port of said comparator circuit.

12. An apparatus for processing an analogue signal as set forth in claim 11, further including an averaging stage interconnected between the output port of the auxiliary circuit and the first input of said amplifier for integrating the resultant signal with respect to time as produced by the logic stage of said auxiliary circuit for input to said amplifier via the first input thereof.

13. An apparatus for processing an analogue signal as set forth in claim 11, further including a feed-back loop connected to the output of said amplifier and to the first input thereof so as to define said amplifier as an operational amplifier.

14. An apparatus for processing an analogue signal as set forth in claim 11, further including an output filter stage connected to-the output of said comparator circuit.

15. An apparatus for processing an analogue signal as set forth in claim 11, further including an inverter stage comprising a pair of complementary MOS transistors each having drain and source regions connected by a control gate, the control gates of said MOS transistors being connected in common to the output of said comparator circuit;

said inverter stage having an output node connected between said pair of complementary MOS transistors, the output node of said inverter stage being connected to the second input of said logic stage of said auxiliary circuit for providing an inverted width-modulated pulse signal thereto;

the source region of one MOS transistor included in said inverter stage being connected to an output of said averaging stage; and the source region of the other MOS transistor of said inverter stage being connected to the output of said amplifier.

16. A method of processing an analogue signal comprising:

provdiding an analogue input signal as a substantially sinusoidal analogue signal;

providing a repetitive ramp signal comprising a rapidly rising forwardly disposed sloping linear portion followed by an abrupt falling vertical linear portion, and repeating the ramp signal over equal time intervals;

comparing the analogue input signal and the repetitive ramp signal;

generating an output signal, as a result of the comparison of the analogue input signal and the repetitive ramp signal, as a width-modulated pulse signal in which the amplitude of the analogue input signal is represented linearly by the pulse widths by providing a positive voltage level when the amplitude of the analogue input signal is greater than the amplitude of the ramp signal and by providing a negative voltage level when the amplitude of the analogue input signal is less than the amplitude of the ramp signal;

providing a rectangular clock pulse signal with falling edges coincident with the abrupt falling vertical linear portions of the repetitive ramp signal;

generating a resultant signal having a first level whenever either one of a clock pulse signal and a width-modulated pulse signal is present on its own and having a second level for all other relationships between the clock pulse signal and the width-modulated pulse signal; and averaging the resultant signal to provide a smoothed average value of the resultant signal as an output signal in which the resultant signal is integrated with respect to time.

17. A method of processing an analogue signal as set forth in claim 16, further including inverting the output signal generated as a width-modulated pulse signal prior to the generation-of the resultant signal; and thereafter generating the resultant signal having a first level whenever either one of a clock pulse signal and an inverted width-modulated pulse signal is present on its own and having a second level for all other relationships between the clock pulse signal and the inverted width-modulated pulse signal.

18. A method of processing an analogue signal as set forth in claim 2, further including amplitude-modulating the width-modulated pulse signal by the output signal provided by the integrated resultant signal.

19. A method of processing an analogue signal as set forth in claim 18, further including generating a second output signal by integrating the amplitude-modulated width-modulated pulse signal with respect to time.

* * * * *